United States Patent [19]

Schaffer

[11] 4,303,985
[45] Dec. 1, 1981

[54] ANALOG VOLTAGE TO PULSE RATE OR ANALOG TO FREQUENCY CONVERTER

[75] Inventor: Max A. Schaffer, Thousand Oaks, Calif.

[73] Assignee: Litton Systems, Inc., Beverly Hills, Calif.

[21] Appl. No.: 101,043

[22] Filed: Dec. 6, 1979

[51] Int. Cl.³ .................. H03L 7/00; H03K 3/72
[52] U.S. Cl. .................. 364/701; 307/271; 328/127; 328/151
[58] Field of Search ............... 340/347 AD; 364/832, 364/835, 701; 307/271, 229, 295; 328/127, 150, 151

[56] References Cited

U.S. PATENT DOCUMENTS

| | | | |
|---|---|---|---|
| 3,022,469 | 1/1962 | Bahrs et al. | 307/295 X |
| 3,376,431 | 4/1968 | Merrell | 307/229 |
| 3,594,649 | 7/1971 | Rauch | 307/271 X |
| 3,643,113 | 2/1972 | Brock et al. | 307/271 |
| 3,660,782 | 5/1972 | Friedman et al. | 307/271 X |
| 3,742,389 | 6/1973 | Hendrickson | 307/271 X |
| 3,749,942 | 7/1973 | Moses | 307/271 |
| 3,778,794 | 12/1973 | Szabo et al. | 307/271 X |
| 3,835,402 | 9/1974 | Kublick | 307/271 X |
| 3,902,139 | 8/1975 | Harrell | 307/271 X |
| 3,921,012 | 11/1975 | Marshall | 307/271 |
| 3,942,110 | 3/1976 | Milkovic | 307/271 X |
| 3,995,178 | 11/1976 | Gilbert | 307/271 |
| 4,016,552 | 4/1977 | Horner et al. | 307/267 |
| 4,109,168 | 8/1977 | Raymond | 307/271 |
| 4,114,149 | 9/1978 | Kendall | 340/347 AD |
| 4,124,821 | 11/1978 | Petr | 307/271 X |

Primary Examiner—Felix D. Gruber
Attorney, Agent, or Firm—Roy L. Brown

[57] ABSTRACT

An apparatus for changing an analog input voltage into a pulse rate particularly characterized by (1) the absence of substantial voltage across switching mechanisms, (2) the generation of pulses having precise charge content, and (3) the production of positive and negative pulses having precisely the same charge content.

7 Claims, 18 Drawing Figures

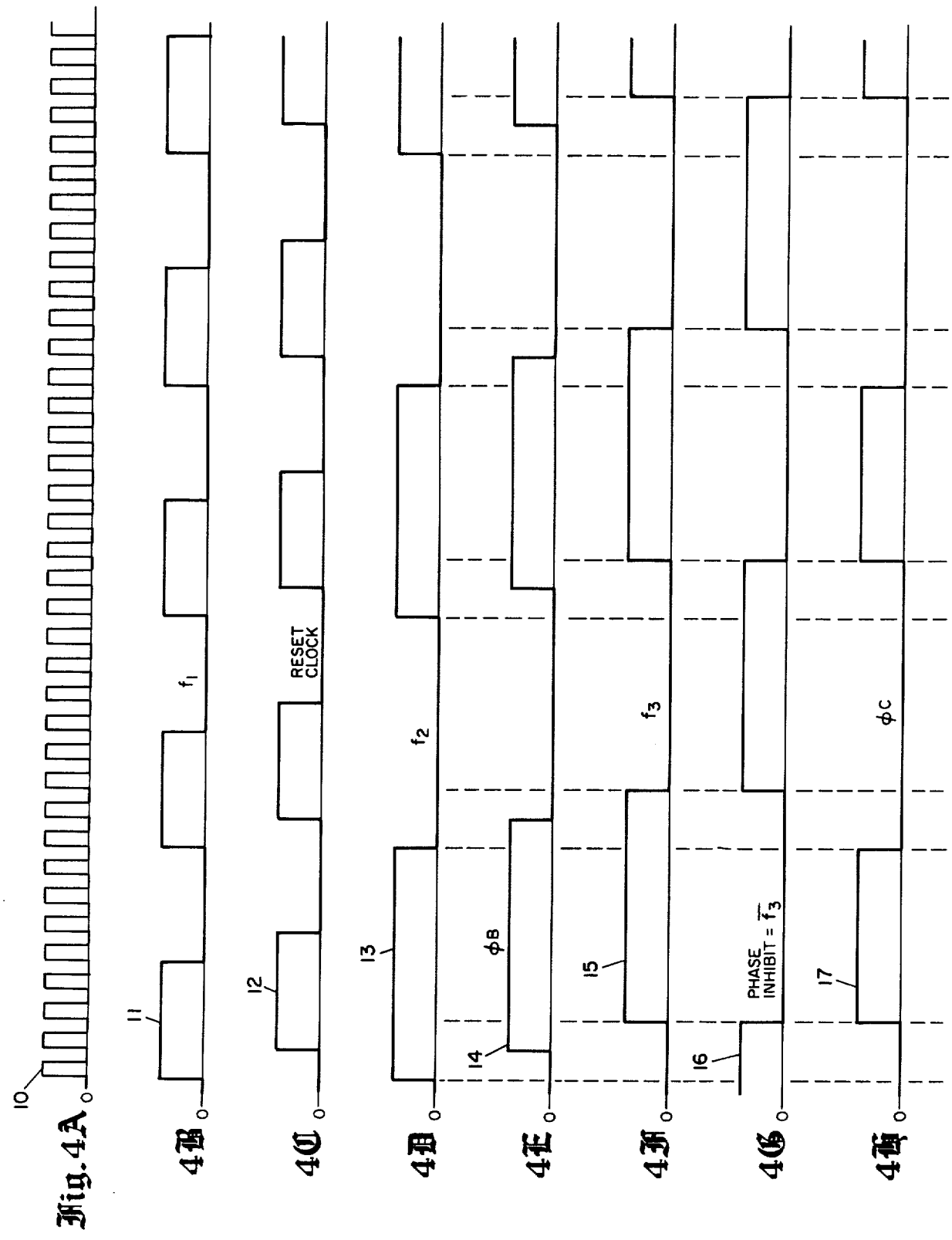

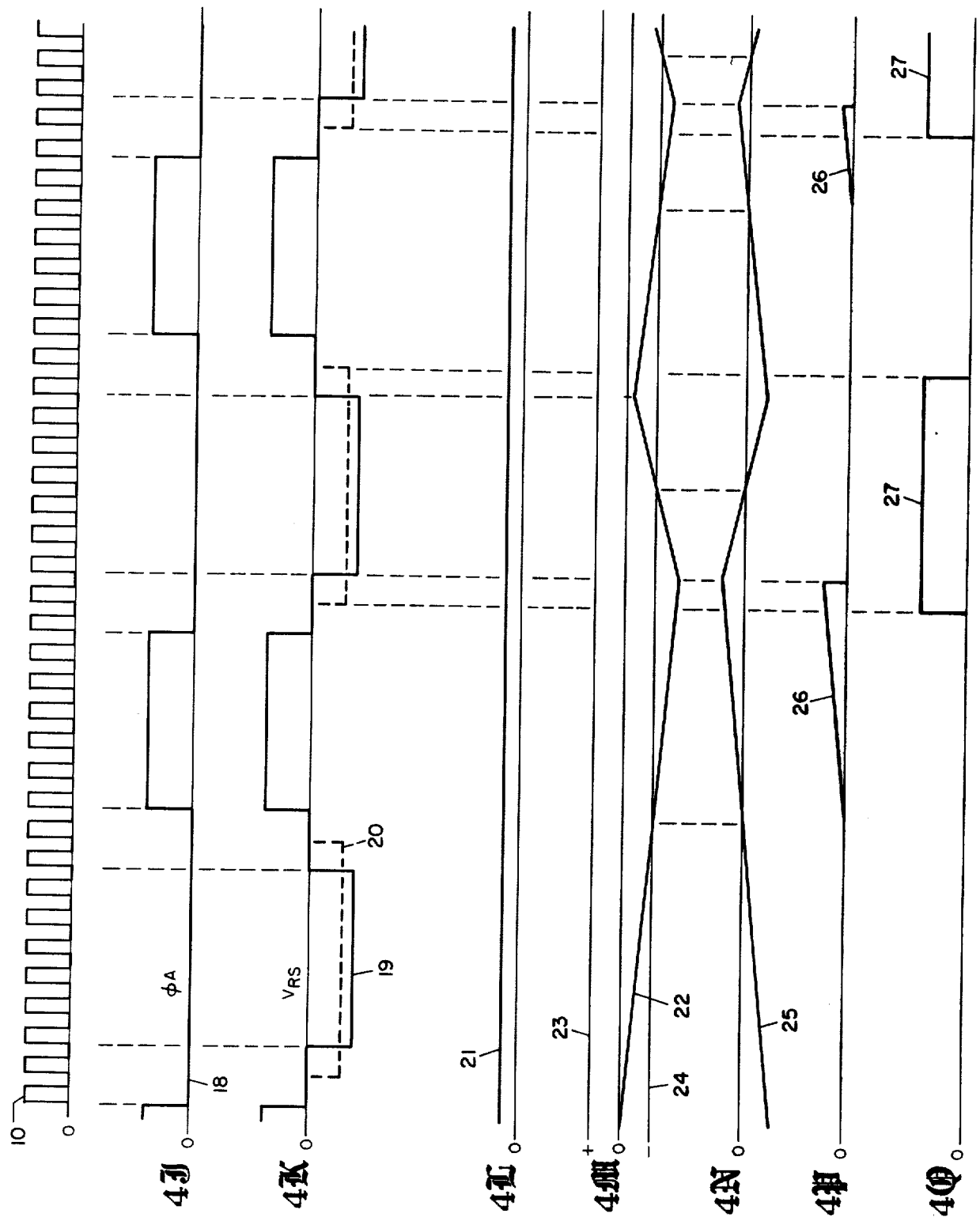

ANALOG VOLTAGE TO PULSE RATE OR ANALOG TO FREQUENCY CONVERTER

BACKGROUND OF THE INVENTION

U.S. Pat. No. 3,970,943 which issued July 20, 1976 to Everett E. Chapman, et al., for "Analog-to-Pulse Integrating Converter" is a typical patent of apparatus for converting an analog signal to pulses whose rate is proportional to the analog signal. The analog signal is integrated, and after the integrated signal reaches a predetermined amplitude, a pulse is generated. Two level detectors are used, one for positive values of the integrated signal and one for negative values of the integrated signal to signal a flip-flop to initiate the output pulse train. When an output pulse is produced, a pulse being a predetermined charge content is delivered back to the input of the integrator, such pulse being of an amplitude and polarity to oppose the effect of the incoming signal. The amount of charge in the feed-back pulse is controlled by a precision power supply and two precision switches, one for positive and the other for negative pulses. When the switches are switched, there is a substantial voltage across the switch, and the use of two precision power supplies and two precision switches require that the power supplies and switches be matched.

There are a number of circuits using the same concept but with various embellishments and improvements.

One of the problems with such apparatus is in establishing precisely the amount of charge in the pulse delivered back to the integrator, and an associated problem is in causing the amount of charge in negative and positive fed-back pulses to be precisely the same.

Still another problem when both positive and negative pulses are fed-back is that the switching from a source of pulses of one polarity to that of another occurs when a relatively high voltage is across the switch, thereby requiring a high voltage switch. When two precision power supplies and two switches are used, both the power supplies and the switches need to be matched.

BRIEF DESCRIPTION OF THE INVENTION

The apparatus contemplated by this invention precisely converts analog signals into a series of pulsed signals. To that end, a resetting pulse generator produces a bipolar signal in which both the positive and negative pulse lobes contain a precise amount of charge. The accuracy is typically in the order of 1.5 parts per million per degree centigrade.

Further, such pulses are switched into the input of the integrator at times when the voltage and current from such pulses are substantially zero. The current then rises and falls before the next switching.

First, one of the fed-back pulses, typically the negative pulse, is delivered a precise amount of charge. A precise positive voltage is gated and delivered to the input of a precise timing amplifier, thereby producing a substantially precise negative pulse. The negative voltage is applied, together with the positive voltage, through a gating circuit to the input of an integrator which produces a small output voltage which is a measure of the difference in charge between that of the negative pulse and the charge under the gated precise positive voltage. That very small voltage produced by the integrator servos the charge in the negative loop into a precise value.

To produce the positive loop at the output of the timing amplifier, the precise positive voltage is inverted and gated to the input of the timing amplifier. The entire output of the timing amplifier, both the positive and negative pulses, is integrated and fed back to the input of the timing amplifier. The integrator integrates the difference in charge content of the positive and negative loops, and the integral is fed back into the timing amplifier with an amplitude which is just enough to ensure that the positive and negative loops have precisely the same charge content.

The gating of the timing amplifier is such that no positive nor negative voltage appears at the output of the timing amplifier at the time of gating. The gating of the positive and negative inputs of the timing amplifier is such that the output of the timing amplifier may be used with the integrator of the converter to subtract from the amplitude of the output of the integrator an exact quantum of charge which is then counted as a measure of the time integral of amplitude of the input of the converter. The converter is called the quantizer because it divides the charge representing the time integral of the input signal into precise pulses or quanta which can be counted.

It is therefore an object of this invention to switch a quantizing pulse source into and out of the input of an integrator, thereby to produce an improved analog to pulse converter.

It is an object of this invention to produce a pulse wave form having a zero amplitude for a predetermined time between positive and negative pulses.

It is a more specific object of this invention to produce a current pulse having a predetermined precise charge content.

It is also an object of this invention to produce a series of negative and positive current pulses wherein the positive and negative pulses have precisely the same charge content.

Other objects will become apparent from the following description, taken in conjunction with the accompanying drawings.

BRIEF DESCRIPTION OF THE DRAWINGS

FIGS. 4A, 4B, 4C, 4D, 4E, 4F, 4G, 4H, 4J and 4K are timing pulse waveforms, plotted against time, as used in this invention;

FIG. 4L is a graph of the input voltage used in the example of the description;

FIG. 4M is a plot of voltage found at the output of the integrator of the analog-to-pulse converter;

FIGS. 4N and 4P are waveform diagrams plotted against time found at various junctions of the analog to pulse converters; and FIG. 4Q is a diagram of the output pulses of the analog-to-pulse converter.

DETAILED DESCRIPTION OF THE INVENTION

All signal waveforms are shown in FIGS. 4A–4P.

Figure 1:
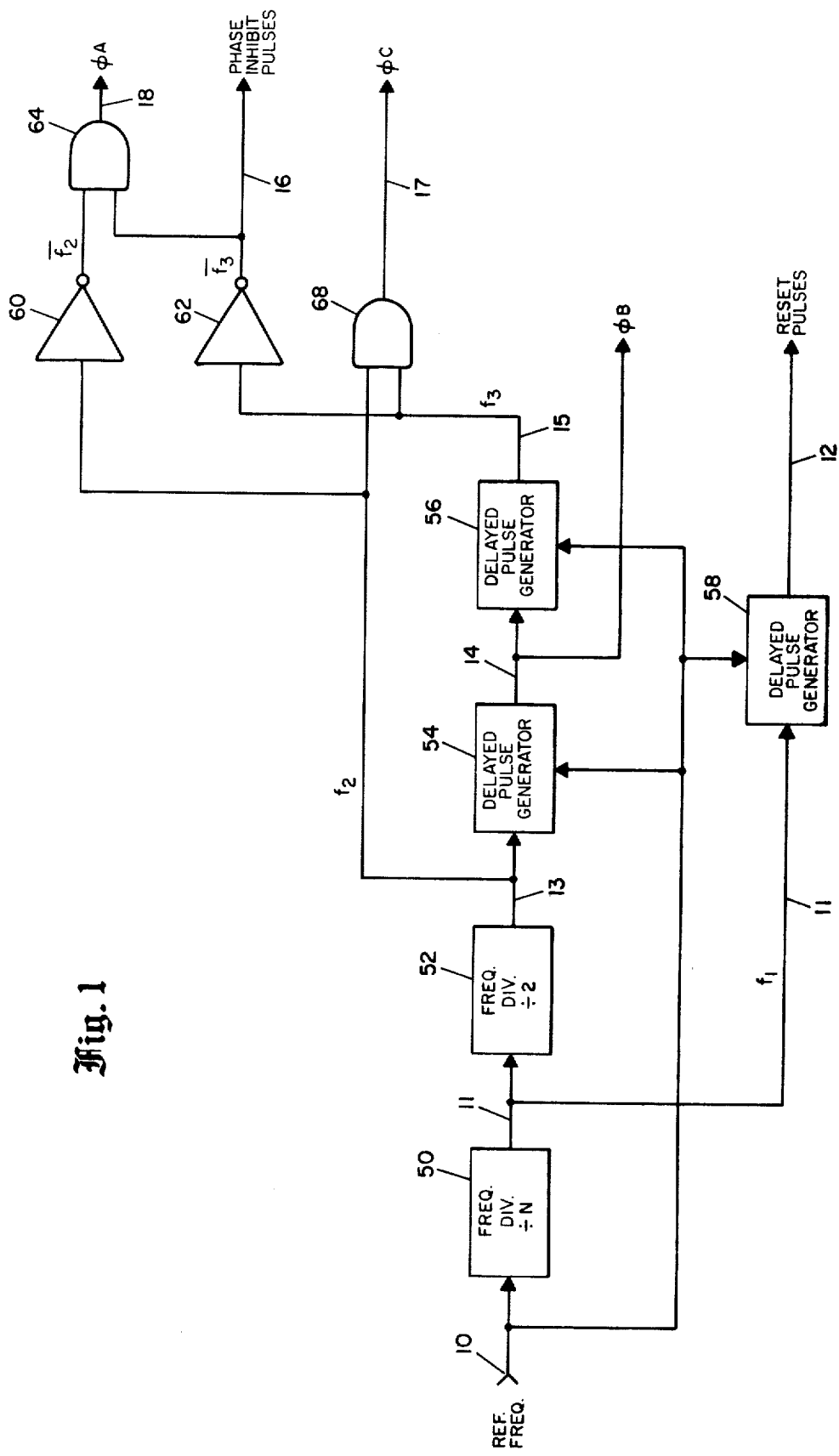
FIG. 1 is a block diagram of a pulse generating circuit.

FIG. 1 shows a pulse generating circuit which is driven by timing pulses such as square wave pulses 10 from a conventional clock circuit (not shown). The pulses 10 are divided by an integral numeral N in frequency divider 50 to produce a signal such as square wave signal 11. The signal 11 is again divided by 2 in frequency divider 52 to produce a signal such as square wave signal 13 at the output of 52. The delayed pulse generator 54 flips on the upstroke of the timing signal 10 to produce a signal such as square wave signal 14 which is identical to 13 but delayed one clock pulse.

The delayed pulse generator 56 flips on the up stroke of the timing signal 10 to produce a signal such as square wave signal 15 which is identical to 14 but delayed one clock pulse.

The delayed pulse generator 58 receives signal 11 and flips on the upstroke of the clock signal 10 to produce a signal 12 at the output of 58 which is identical to signal 11 but delayed one clock pulse.

The inverting amplifiers 60, 62 invert the signals 13 and 15, respectively. The output of amplifier 62 is shown at 16.

The outputs of amplifiers 60, 62 are connected to the AND gate 64 to produce a signal 18 when signals 13 and 15 are both low.

The signals 13 and 15 are connected to AND gate 68 to produce a signal 17 when signals 13 and 15 are both high.

Figure 2:
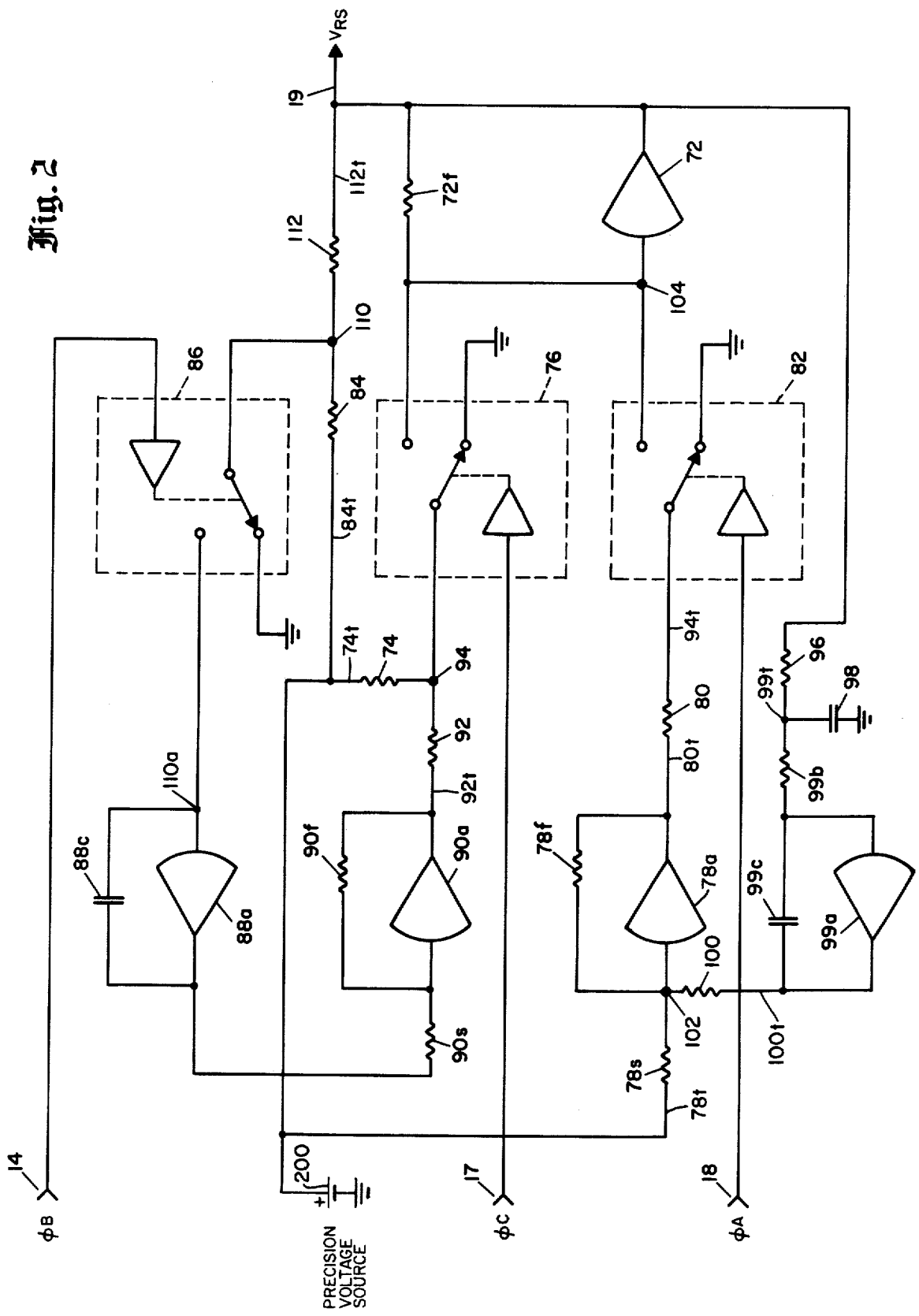
FIG. 2 is a circuit diagram of a circuit for producing properly timed precisely charged signals according to this invention.

FIG. 2 is a circuit which is directed to producing properly timed precisely charged signals 19 for reducing the output of the integrator 70a, 70b, 70c, (See FIG. 3) of the quantizer according to this invention.

A precisely held DC voltage produced in a precision power supply 200 is delivered to the input of the inverting amplifier 72 through resistor 74 when switching circuit 76 is closed. Circuit 76 is shown as an amplifier driven mechanical switch, but it is preferably a CMOS FET switching circuit (not shown) according to the prior art. The feedback resistor 72f completes the inverting amplifier circuit. The same DC voltage is inverted in the inverting amplifier circuit comprising series resistor 78s, amplifier 78a and feedback resistor 78f. That inverted voltage is fed through resistor 80 and a switching circuit 82, preferably a CMOS FET circuit (not shown), into the input of inverting amplifier 72. The same DC voltage is delivered through resistor 84 and the switching mechanism 86, preferably a CMOS FET circuit (not shown), into the input of integrator 88a, 88c.

The output of integrating amplifier 88a is inverted by inverting amplifier circuit 90s, 90a, 90f. Then it is delivered through resistor 92 to the summing junction 94.

The output of amplifier 72 is delivered, through R-C filter 96, 98 to the integrator 99a, 99b, 99c. The output of integrating amplifier 99a is delivered through resistor 100 to summing junction 102.

The switching circuit 76 is controlled by the signal 17. The switching circuit 82 is controlled by the signal 18. The switching circuit 86 is controlled by the signal 14.

Figure 3:
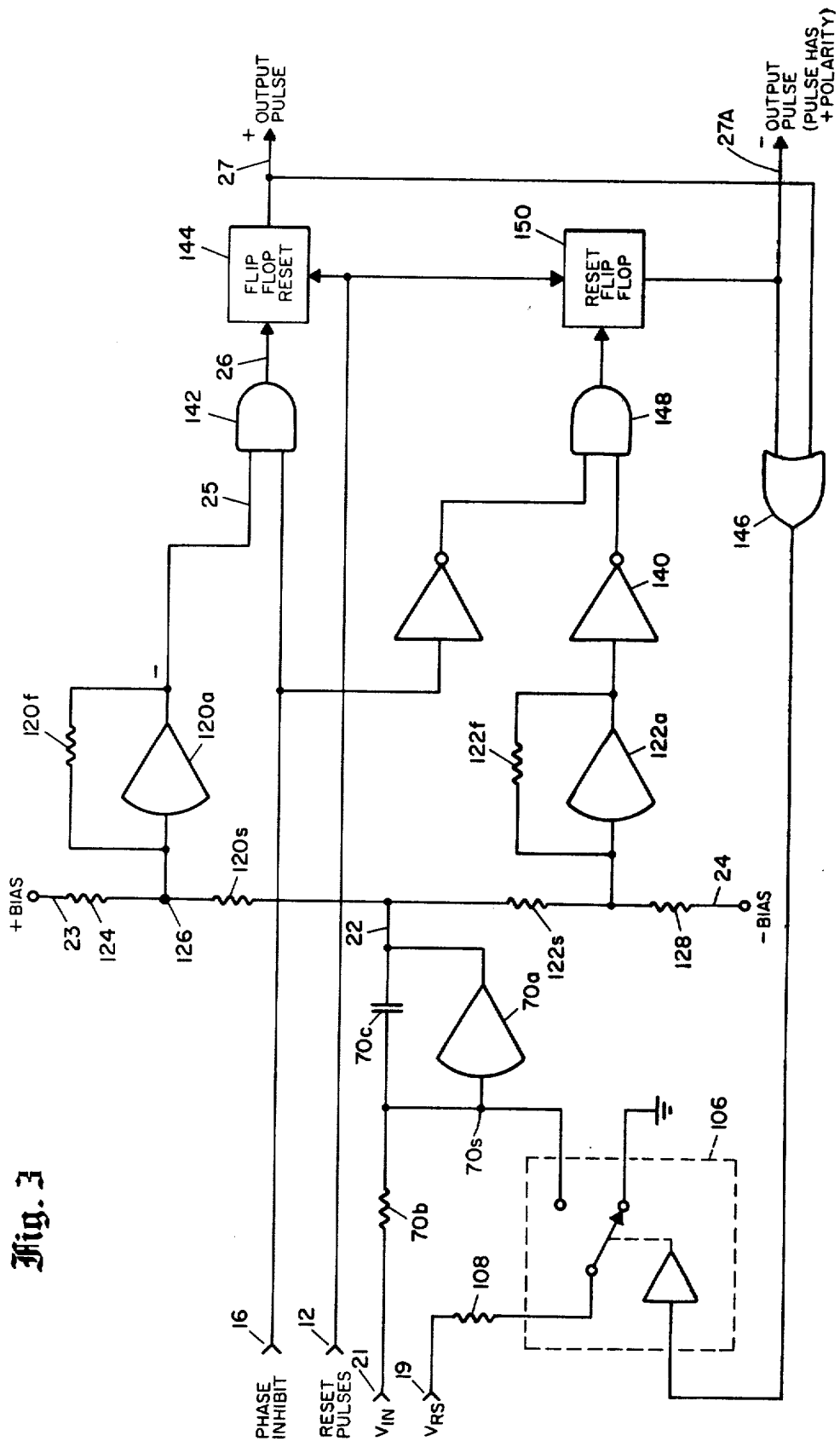
FIG. 3 is a circuit diagram, partly in block, of a precision analog to pulse converter circuit.

The timing signals 17 and 18 control the switching members 76 and 82 to cause alternately plus and minus signals to be delivered from the DC reference voltage and its inverse to the summing junction 104 of the inverting amplifier 72 to produce alternating polarity voltages at the output of amplifier 72. The timing is controlled so that the voltage at the output of amplifier 72 has a zero voltage at the time of switching of switching circuit 106 (FIG. 3). Switching circuit 106 is preferably an electronic switching member such as CMOS FET chip (not shown). Note that the output of amplifier 72 is delivered through the switching circuit 106 and resistor 108 to the summing junction 70s integrator 70a, 70b, 70c.

For use in the quantizer of FIG. 3, the positive and negative current loops of waveform 19 must have a precise quantum of charge, and the amount of charge in the positive pulse must be the same as the amount of charge in the negative pulse.

To cause the negative loop of current waveform 19 to have a precise predetermined charge content, a precise DC reference voltage is delivered from source 200 through resistor 84, to summing junction 110. The output of amplifier 72 is also delivered through resistor 112 to summing junction 110. During the period when the output of amplifier 72 is positive, the switching device 86 is open. During the period when the output of amplifier 72 is negative, the switching device 86 is closed to connect summing junction 110 to the input of integrating amplifier 88a. During the entire time the switching device 86 is closed, the DC reference voltage is applied to the integrator and that voltage (but reversed in polarity) is shown dashed at 20 in FIG. 4K. The negative pulse of voltage waveform 19 is also shown. Any difference in area between the negative pulse of waveform 19 and the pulse shown as 20 produces a voltage at the output of integrating amplifier 88a, which is again reversed in polarity by the members 90s, 90a, 90f and delivered through resistor 92 to modify the current flow at the junctions 94 and 104 when the switching device 76 is closed, thereby to servo or cause the charge content of the negative pulse of 19 precisely to equal the charge content of the pulse 20.

To make the charge content of the positive pulse of waveform 19 precisely equal to that of the negative pulse, the integrator 99a, 99b, 99c integrates the output of amplifier 72. Should the charge content of one of the positive or negative pulses be different than that of the other, a current will be delivered from the integrator through resistor 100 and by amplifier 78a through resistor 80 and switching device 82 to the summing junction 104, thereby modifying the amplitude of one pulse to make its charge equal the charge of the pulse of opposite polarity.

FIG. 3 shows the quantizer of this invention which uses the output current of waveform 19 as a quantizing current.

The quantizer of this invention is shown in FIG. 3. An input voltage, shown at 21 in FIG. 4L, is delivered to the input of integrator 70a, 70b, 70c. The signal 21 is shown as a constant signal which is legitimate provided the sampling rate is rapid relative to the rate of change of the input voltage. The maximum allowable speed of change of the input signal occurs, according to the sampling theorem, when the sampling rate is twice the highest frequency in the input signal.

The output of the integrating amplifier 70a is delivered to two inverting amplifiers 120a, 120s, 120f and 122a, 122s, 122f. A positive bias voltage 23 is delivered through resistor 124 to summing junction 126, and an equal but negative bias voltage 24 is delivered through resistor 128 to summing junction 130. The output of amplifier 122a is inverted in inverting amplifier 140.

The output signal from amplifier 120a is delivered, together with signal 16 to the input of AND gate 142 which produces a signal 26 only when both the output of amplifier 120a and signal 16 are positive. An output signal 26 causes flip-flop 144 to flip and produce an output pulse on the next up-stroke of the reset pulse 12. The output pulses 27 are positive and signify that the input signal is positive. The output pulses 27 are delivered through OR gate 146 to control the switching apparatus 106.

When a negative input signal is applied at 21, the signal at 22 becomes positive, and the output signal of amplifier 122a becomes negative. The negative signal is inverted by inverting amplifier 140 and delivered to AND gate 148. An inversion of the phase inhibit signal 16 is also delivered to AND gate 148. When both inputs to gate 148 are positive, a signal is delivered to flip-flop 150 which flips on the next reset pulse upstroke. The output of flip-flop 150 is a positive pulse which can be counted at terminal 27A as a measure of the amplitude of the integral of the negative input signal 21. The output of flip-flop 150 is connected to OR gate 146 to close the gating circuit 106 whenever the output of flip-flop 150 occurs.

Whenever an output pulse is produced by either flip-flop 144 or flip-flop 150, gating circuit 106 is closed, and the timing from the described circuitry is such that the $V_{RS}$ signal 19 is zero at the time the circuitry 106 closes. That is, the closure of circuitry 106 occurs approximately a clock pulse ahead of a positive or negative pulse of 19. The pulse 19 is then integrated in the integrating amplifier 70a, and it is of a polarity to subtract a precise predetermined quantum of charge from the signal 22. Consider FIG. 4L which shows a constant input voltage 21. The input voltage is slowly changing compared to the sampling rate, whereby assuming a constant input voltage for explanation purposes is appropriate. The integral of the input voltage 21 produces a ramp voltage 22 at the output of the integrating amplifier 70a. The voltage 22 produces an output voltage pulse 27 or a pulse 27A at the output of flip-flop 150, depending upon the polarity of voltage 22. The presence of either an output voltage 27 OR a voltage 27A from flip-flop 150 delivers a controlling pulse through OR gate 146 to close the gating circuit 106 immediately before before a pulse of voltage occurs in the voltage wave 19, whereby there is no applied voltage (other than the control voltage) across the switching mechanism 106 at the time of switching. The timing of the output pulses is such that only the pulse of voltage 19 which has the proper polarity to subtract from the voltage 22 is delivered to the input of integrating amplifier 70a. Referring to FIGS. 4J, 4K, 4L, 4M, 4N, 4P, 4Q the positive voltage 21 produces a negative going ramp voltage 22 which continues to grow until a negative pulse of voltage 19 occurs during an output pulse 27. The negative pulse 19 which is delivered to the integrating amplifier 70a reduces the amplitude of the voltage 22, and it may actually reverse the polarity of voltage 22. It removes a predetermined quantum of charge from the integrating condenser 70c. The inverting amplifier 120a inverts the wave form 22 and offsets it by the amount of the bias voltage 23. When the output of amplifier 120a becomes positive, the voltage 26 also becomes positive for the duration of the phase inhibit pulse 16. A positive voltage 26 enables the flip-flop to flip to the next upstroke of the reset pulse signal 12. The flip-flop then resets at the next upstroke of the reset clock pulse 12, producing output pulse 27. The number of pulses 27 minus the number of pulses 27A at the output of the flip-flop 150 is proportional to and is a measure of the integral of the input voltage 21. The pulse rate is proportional to the amplitude of the voltage 21.

Thus, the apparatus of this invention is first a quantizer which converts analog voltages into pulsed voltages, such quantizer having the unique feature that there is no voltage across the switch contacts of the switching mechanism 106 at the time of switch closing and opening.

Secondly, the apparatus of this invention uses a unique pulse generator wherein the positive and negative pulses have a precise amount of charge content, and the charge content is balanced between the pulses. This occurs because of the servo loop with the integrator 88a, 88c, 84, 112 and because of the servo loop with the integrator 99a, 99b, 99c.

It is also apparent that although the charge content of the negative pulse of voltage 19 depends upon the amplitude of the voltage reference, that charge content may be scaled by changing the relative values of the resistors 84, 112 and the capacitance of capacitor 88c.

Further, in accordance with the usual operation of integrators, the time constants of the integrators may be varied by changing the scaling.

It is also apparent that the various switching mechanisms, although preferably CMOS FET's, may be any other kind of electrical or mechanical switching mechanism which operates rapidly enough for the particular speed of applied voltage change. The sampling theorem requires the sampling rate to be at least twice the frequency of the highest frequency component to be followed in the applied voltage.

Although the invention has been described in detail above, it is not intended that the invention be limited by that description, but only in accordance with that description taken together with the accompanying claims.

What is claimed is:

1. Apparatus for producing pulses having a predetermined charge content comprising:
    a first summing amplifier having a plurality of input terminals and including scaling resistors, an operational amplifier, and feedback resistor, for receiving signals to be algebraically summed;
    apparatus for applying signals from said input terminals to the operational amplifier of said summing amplifier to produce output pulses;
    a first current integrating apparatus having first and second input terminals and including scaling resistors, an operational amplifier and feedback capacitor, said first input terminal being connected to receive the output pulses from said first summing amplifier;
    a source of precision voltage connected to said second input terminal of said integrating apparatus and to a first input terminal of said first summing amplifier;
    the output of said integrating apparatus being connected through a first polarity inverter to a second said input terminal of said first summing amplifier to control the amplitude of the algebraic sum of the charge under positive and negative pulses of the output of said first summing amplifier to be equal to the time integral of said precision voltage.

2. Apparatus as recited in claim 1 in which the pulses formed by said first summing amplifier and integrared by said integrating apparatus are opposite in polarity to said precision voltage.

3. Apparatus as recited in claim 1 in which said first summing amplifier produces a predetermined periodic sequence of positive and negative pulses, and further comprising first chopping apparatus, for chopping the current applied to the operational amplifier of said current integrating apparatus, timed to integrate only when said output pulses of said first summing amplifier and said precision voltage are opposite in polarity, whereby only said output pulses having a polarity opposite to the polarity of said precision voltage are controlled in charge content.

4. Apparatus as recited in claim 3 in which said apparatus for applying signals further comprises second chopping apparatus for chopping the current applied from said first and second input terminals to the input of the operational amplifier of said first summing amplifier.

5. Apparatus as recited in claim 4 and further comprising:

a second summing amplifier having first and second input terminals and including scaling resistors, an operational amplifier and a feedback resistor, connected by its output to a third said input terminal of said first summing amplifier, said apparatus for applying signals further comprising a third chopping apparatus for chopping the current applied from said third terminal to the input of the operational amplifier of said first summing amplifier;

said precision voltage source being connected to a first said input terminal of said last-named polarity inverter;

second integrating means having an input terminal and including a scaling resistor, an operational amplifier and a feedback capacitor, connected by said input terminal to the output terminal of said first summing amplifier to produce a signal which is a measure of the difference between the charge content of positive and negative pulses in said first summing amplifier output signal, the output signal of said second integrating apparatus being connected to the second said input terminal of said last-named polarity inverter; and said second and third chopping apparatus being timed such that no more than one of said second and third chopping apparatus is closed at any time;

whereby the charge content of positive and negative output pulses are controlled to be equal in charge content.

6. Apparatus as recited in claim 5 in which the closing of said third and fourth chopping apparatus are timed such that the duration of said output pulses are substantially identical, alternating in polarity, and there are substantially equally-timed zero-signal spaces between said alternating polarity pulses.

7. Apparatus as recited in claim 6 and further comprising an analog to pulse-rate converter including a third integrating apparatus having first and second input terminals and including scaling resistors, an operational amplifier and a feedback capacitor, connected to receive an analog input signal on said first input terminal and to receive the output of said first summing amplifier on said second input terminal, the output of said third integrating apparatus being connected in parallel into two output channels designated as the positive and negative output pulse channels, respectively, said two output channels being configured, respectively, to sense the positive and negative amplitudes of the output of said third integrating apparatus to produce two series of pulses depending upon the polarity and amplitude of the input signal, the output pulses being synchronized with the pulses of the output of said first summing amplifier but rising and falling during the times of zero signal from said first summing amplifier, the pulses of said output channels being in phase opposition;

further comprising a fourth chopping apparatus connected between the output of said first summing amplifier and the summing junction of said third integrating apparatus;

the pulse outputs of said two output channels being connected to close said fourth chopping apparatus whenever an output pulse occurs in either of said output channels, the timing of said output pulses being such that whenever an output pulse appears in the positive output channel, a precisely charged negative pulse appears, after a time delay, at the output of said first summing amplifier, and whenever a pulse appears in the negative output channel, a precisely charged positive pulse appears, after a time delay, at the output of said first summing amplifier;

whereby, precisely charged pulses from the output of said first summing amplifier subtract from the effect of signals at said input terminal.

* * * * *